(12) United States Patent
Quintanilha et al.

(10) Patent No.: US 11,442,368 B2
(45) Date of Patent: Sep. 13, 2022

(54) INSPECTION TOOL, INSPECTION METHOD AND COMPUTER PROGRAM PRODUCT

(71) Applicant: ASML NETHERLANDS B.V., Veldhoven (NL)

(72) Inventors: Richard Quintanilha, Heidenheim an der Brenz (DE); Scott Anderson Middlebrooks, Duizel (NL); Adrianus Cornelis Matheus Koopman, Hilversum (NL); Albertus Victor Gerardus Mangnus, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 112 days.

(21) Appl. No.: 17/051,287

(22) PCT Filed: Apr. 5, 2019

(86) PCT No.: PCT/EP2019/058672
§ 371 (c)(1),
(2) Date: Oct. 28, 2020

(87) PCT Pub. No.: WO2019/211061
PCT Pub. Date: Nov. 7, 2019

(65) Prior Publication Data
US 2021/0232052 A1 Jul. 29, 2021

(30) Foreign Application Priority Data
Apr. 30, 2018 (EP) .................................... 18170175

(51) Int. Cl.
*G03F 7/20* (2006.01)
*G01B 11/24* (2006.01)
*G01B 15/04* (2006.01)

(52) U.S. Cl.
CPC .......... *G03F 7/70616* (2013.01); *G01B 11/24* (2013.01); *G01B 15/04* (2013.01); *G03F 7/705* (2013.01)

(58) Field of Classification Search
CPC ......... G01B 11/24; G01B 15/04; G03F 7/705; G03F 7/70616; G03F 7/70625
See application file for complete search history.

(56) References Cited

U.S. PATENT DOCUMENTS

| 7,973,921 B2* | 7/2011 | Silberstein ....... G01N 21/95623 356/237.5 |
| 2014/0320627 A1 | 10/2014 | Miyamoto et al. |
| 2017/0357159 A1 | 12/2017 | Kant et al. |

FOREIGN PATENT DOCUMENTS

| JP | 2017538156 | 12/2017 |
| WO | 2017050523 | 3/2017 |

OTHER PUBLICATIONS

International Search Report issued in corresponding PCT Patent Application No. PCT/EO2019/058672, dated May 9, 2019.
(Continued)

*Primary Examiner* — Peter B Kim
(74) *Attorney, Agent, or Firm* — Pillsbury Winthrop Shaw Pittman LLP

(57) ABSTRACT

A method of determining a measurement sequence for an inspection tool inspecting a structure generated by a lithographic process performed by a lithographic system is presented, the method including deriving a model for the lithographic process as performed by the lithographic system, the model including a relationship between a set of system variables describing the lithographic system and an output variable representing the structure resulting of the lithographic process, determining an observability of one or
(Continued)

more system variables in the output variable, and determining the measurement sequence for the inspection tool, based on the observability.

20 Claims, 6 Drawing Sheets

(56) References Cited

OTHER PUBLICATIONS

Korean Office Action issued in corresponding Korean Patent Application No. 10-2020-7031476, dated Apr. 4, 2021.

* cited by examiner

INSPECTION TOOL, INSPECTION METHOD AND COMPUTER PROGRAM PRODUCT

CROSS-REFERENCE TO RELATED APPLICATIONS

This application is the U.S. national phase of PCT patent application no. PCT/EP2019/058672, which was filed on Apr. 5, 2019, which claims the benefit of priority of European patent application no. 18170175.6 which was filed on Apr. 30, 2018, and which is incorporated herein in its entirety by reference.

BACKGROUND

Field of the Invention

The present invention relates to a method of determining a measurement sequence for an inspection tool, a inspection tool and a computer program product.

Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The radiation beam as typically applied in lithographic apparatuses may e.g. be a DUV radiation beam (e.g. having a wavelength of 248 nm or 193 nm) or an EUV radiation beam (e.g. having a wavelength of 11 nm or 13.5 nm).

The manufacturing of an integrated circuit may typically require the stacking of a plurality of layers, whereby the layers need to be accurately aligned. Without such an alignment, a required connection between layers may be flawed, resulting in a malfunctioning of the integrated circuit.

Typically, the bottom layer or layers of the integrated circuit will contain the smallest structures, such as transistors or components thereof. The structures of subsequent layers are typically larger and enable connections of the structures in the bottom layers to the outside world. In view of this, an alignment of two layers will be the most challenging in the bottom portion of the integrated circuit.

In order to ensure that a circuit or a circuit layer is properly patterned, substrates are often subjected to inspection, using inspection tools such as e-beam inspection tools. Such tools may e.g. be applied to assess whether or not certain process steps, as. e.g. performed by a lithographic apparatus, are executed as expected.

It would be desirable to improve the performance of e-beam inspection tools such as high resolution SEMs as currently available. In particular, it would be desirable to reduce the duration required for inspecting a substrate or sample.

SUMMARY

It is desirable to improve the performance of e-beam inspection tools, in particular, it would be desirable to reduce the duration required for inspecting a substrate or sample.

In order to address these concerns, according to an aspect of the present invention, there is provided a method of determining a measurement sequence for an inspection tool inspecting a structure generated by a lithographic process performed by a lithographic system, the method comprising:
  deriving a model for the lithographic process as performed by the lithographic system, the model including a relationship between an set of system variables describing the lithographic system and an output variable representing the structure resulting of the lithographic process,
  determining an observability of one or more system variables in the output variable, and;
  determining the measurement sequence for the inspection tool, based on the observability.

According to another aspect of the present invention, there is provided an inspection tool comprising:
  an object table configured to hold a sample, the sample comprising a structure;
  probing means configured to inspect the sample;
  a detector configured to detect a response signal of the sample caused by interaction of the probing means with the sample;
  a processing unit configured to:
    receive the response signal from the detector;
    generate an image of the structure based on the response signal;
  wherein the processing unit is further configure to:
    receive a measurement sequence for inspecting the structure, the measurement sequence being obtained by a method according to the present invention and inspect the sample according to the received measurement sequence.

In an embodiment, the probing means comprise an electron beam source configured to generate an electron beam; and a beam manipulator configured to direct the electron beam onto the sample, and wherein the detector is configured to detect a response signal of the sample caused by interaction of the electron beam with the sample.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
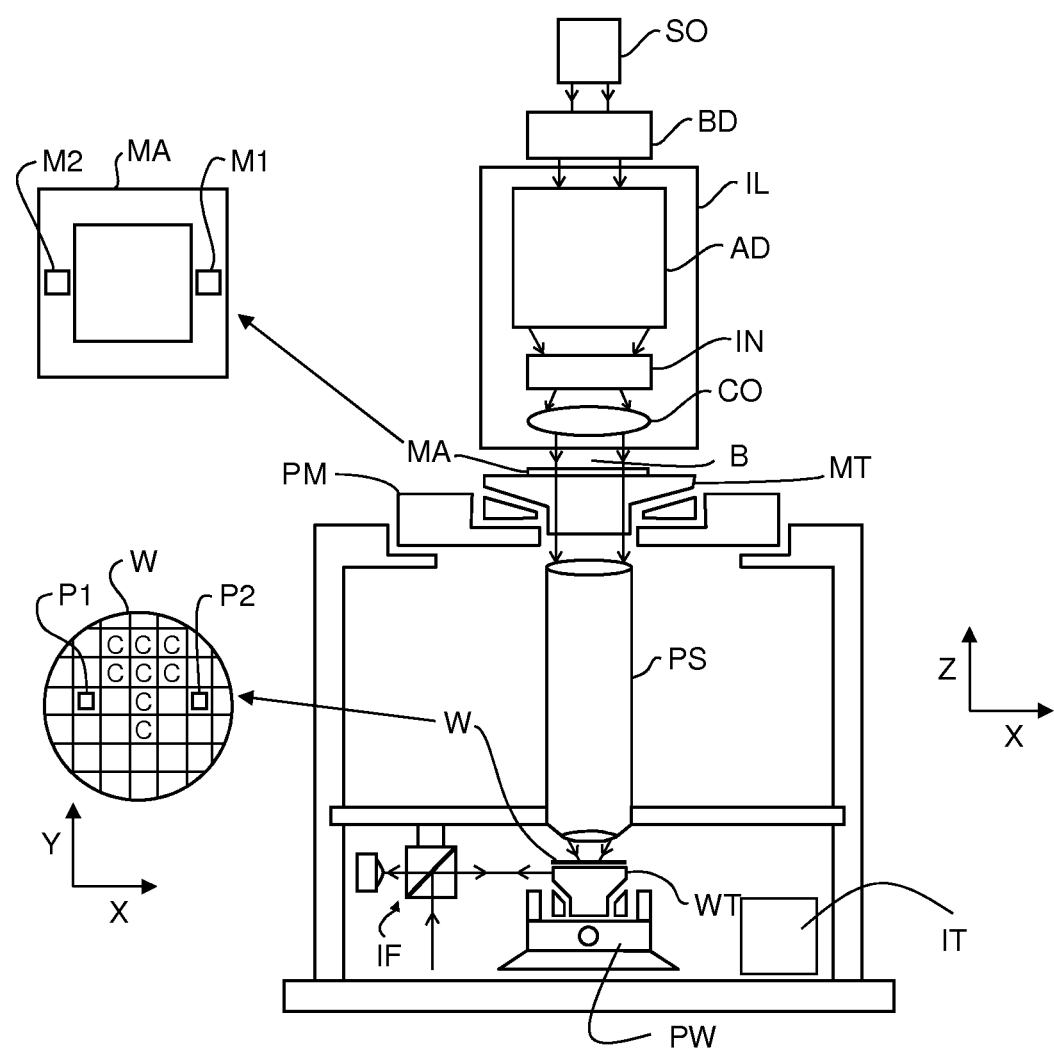
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask)

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioning device PW. In the case of a stepper (as opposed to a scanner) the mask table MT may be connected to a short-stroke actuator only, or may be fixed. Mask Mass. and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.
2. In scan mode, the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.
3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In the embodiment as shown, the lithographic apparatus further comprises an inspection tool IT according to the invention. Such an inspection tool IT may e.g. enable to determine a characteristic of a structure, in particular a buried structure that is present on or in an area of interest of a substrate W that is processed by the lithographic apparatus. In an embodiment, as will be discussed in more detail below, the inspection tool may comprise an electron beam source for inspecting the substrate.

In an embodiment, the second positioning device PW may be configured to position the substrate W in the operating range of the inspection tool IT. In such an embodiment, the inspection tool IT may e.g. be configured to determine a characteristic of the mentioned structure, e.g. an electric characteristic, a material characteristic and/or a geometric characteristic. In an embodiment, this information may subsequently be provided to a control unit of the lithographic apparatus and used during the exposure process, e.g. by controlling one or more of the illumination system, the projection system or one of the positioning devices, based on the information.

In the embodiment as shown, the lithographic apparatus may be configured to apply DUV radiation for the radiation beam. In such case, the patterning device MA may be a transmissive patterning device and the projection system PS may comprise one or more lenses.

Alternatively, the lithographic apparatus according to the present invention may be configured to apply EUV radiation for the radiation beam. In such case, the patterning device MA may be a reflective patterning device and the projection system PS may comprise one or more mirrors. In such embodiment, the apparatus may comprise one or more vacuum chambers for housing the illumination system IL and/or the projection system PS.

In accordance with an aspect of the present invention, the lithographic apparatus may comprise an inspection tool according to the present invention, in order to perform an inline or offline inspection of a substrate that is to be processed or has been processed.

According to an aspect of the invention, there is provided an inspection tool configured to inspect an object such as a semiconductor substrate. In accordance with the present invention, the inspection tool is configured to probe the object, e.g. the semiconductor substrate or sample. Such probing of the sample may be performed in various manners, using various probing means. Examples of probing means that can be used to probe a sample, i.e. interact with a sample so as to generate a signal containing information about a state of the sample, are optical inspection means such as inspection beam sources, e.g. laser sources, electromagnetic radiation source such as X-ray beam sources, Atomic force probes or electron beam sources.

In below description, an inspection tool 10 according to the present invention is illustrated which comprises an electron beam source as probing means. As will be appreciated by the skilled person, the method according to the present invention may also be practiced using one or more of the alternative probing means as indicated.

Figure 2:
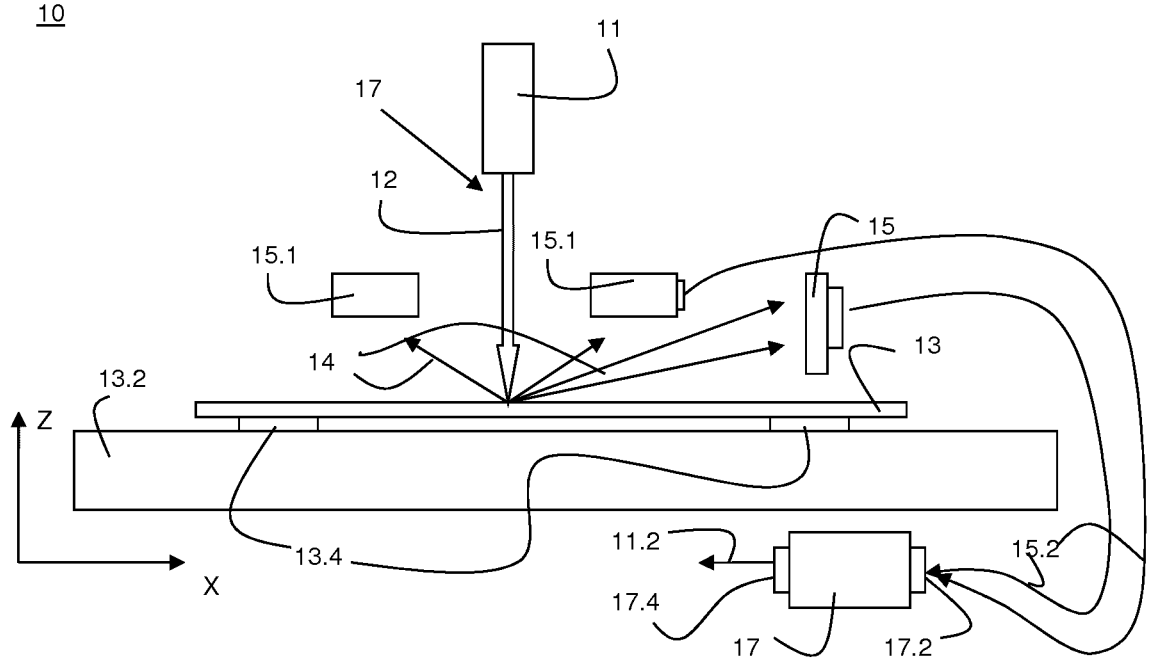
FIG. 2 depicts an inspection tool according to an embodiment of the invention.

FIG. 2 thus shows an embodiment of an inspection tool 10 according to the present invention that comprises an electron beam source 11, further on also referred to as an e-beam source 11.

Such an e-beam source 11 is known in general, and may be applied in the present invention to project an electron beam 12 onto an area of an object 13, e.g. a substrate. In the embodiment as shown, the object 13 is mounted to an object table 13.2 by means of a clamping mechanism 13.4, e.g. a vacuum clamp or an electrostatic clamp. The area of the object onto which the e-beam is projected may also be referred to as sample. Such an e-beam source 11 may e.g. be used to generate an electron beam 12 having an energy ranging from 0.2 keV to 100 keV. An e-beam source 11 may typically have one or more lenses for focusing the electron beam 12 onto a spot of about 0.4 to 5 nm in diameter. In an embodiment, the e-beam source 11 may further comprise one or more scanning coils or deflector plates which may deflect the electron beam 12. By doing so, the electron beam 12 may e.g. be deflected along an X-axis and an Y-axis (perpendicular to the X-axis and the Z-axis), the XY-plane being parallel to a surface of the object, such that an area of the object can be scanned.

In an embodiment of the present invention, the electron beam source is configured to project a plurality of electron beams onto a respective plurality of sub-areas of the area of interest. By doing so, the area of interest that can be examined or inspected per unit of time may be enlarged. Further, in an embodiment of the present invention, the electron beam source may be configured to generate electron beams having a different energy level. As will be explained in more detail below, depending on the applied energy level for the e-beam or beams, different portions or a structure, e.g. a buried structure, may be examined.

When such an e-beam 12 impinges on the surface, interactions on the surface and interactions with the material below the surface will occur, resulting in the exposed surface emitting both radiation and electrons. Typically, when an electron beam 12 interacts with a sample, the electrons constituting the beam will lose energy through scattering and absorption, within a teardrop-shaped volume, known as the interaction volume. The energy exchange between the electron beam and the sample will typically result in a combination of:
- an emission of secondary electrons by inelastic scattering,
- an emission of electrons that are reflected or back-scattered out of the interaction volume by elastic scattering interactions with the sample,
- X-ray emission, and
- an emission of electromagnetic radiation, e.g. in a range from deep UV to IR.

The latter emission of electromagnetic radiation is generally referred to as cathodoluminescent light or CL-light.

In an embodiment of the present invention, the inspection tool 10 further comprises a detector 15 for detection of secondary electrons and a detector 15.1 for back-scattering electrons as emitted by a sample. In FIG. 2, the arrows 14 are indicative for the emitted secondary or back-scattering electrons.

In the embodiment as shown, the inspection tool further comprises a control unit 17 or processing unit, e.g. comprising a microprocessor, computer or the like, for processing the emitted secondary or back-scattering electrons as detected by the detectors 15 and 15.1.

In an embodiment, the control unit 17 comprises an input terminal 17.2 for receiving signals 15.2 from the detectors 15, 15.1, the signals 15.2 representing the detected emitted secondary or back-scattering electrons.

In an embodiment, the control unit may further have an output terminal 17.4 for outputting a control signal 11.2 for controlling the e-beam source 11. In an embodiment, the control unit 17 may control the e-beam source 11 to project an e-beam 12 onto an area of interest of the object to be inspected, e.g. a semiconductor substrate.

In an embodiment, the control unit 17 may be configured to control the e-beam source 11 to scan the area of interest.

During such scanning of an area of interest of an object, the detector may receive secondary or back-scattering electrons 14 from different portions of the area of interest. As an example, the applied e-beam may e.g. have a cross-section of 1-4 nm in diameter, while the area of interest is 100 nm×100 nm. As such, when the area of interest has been scanned, a response to the e-beam across the area of interest may have been captured by detectors 15, 15.1, where the detected signal is comprised of detected electrons per illuminated pixel. The pixel size may e.g. be smaller or larger than the cross-section of the e-beam.

In accordance with an embodiment of the present invention, the control unit may be configured to receive, e.g. via an input terminal such as input terminal 17.2 or another input terminal, a measurement sequence or a set of instructions representative of the measurement sequence, as determined by a method according to the present invention. In particular, the present invention provides, in an embodiment, in a method of determining a measurement sequence for inspecting a structure by an inspection tool, e.g. an electron beam inspection tool such as a SEM.

In known inspection tools such as SEMs, an area of interest including a structure to be inspected is typically subjected to a two-dimensional scanning of the area, whereby substantially the entire area is covered, i.e. inspected by a scanning electron beam. Such a scanning process can be rather time-consuming. The scanning of an area of e.g. 1 μm×1 μm with a sufficiently high resolution may require a few seconds. As an example, a grating structure may be examined by scanning the grating by a SEM, in order to determine a CD or CD uniformity of the grating or lines of the grating. Alternatively, or in addition, one may be interested in certain line parameters of the grating, such as line edge roughness (LER), line width roughness (LWR) or side wall angle (SWA). It will however be acknowledged by the skilled person that, in order to assess these parameters, e.g. CD uniformity or LER, only a small portion of the SEM image as generated is required. If it would be known beforehand which portion or portions of the SEM image would be required to assess a certain parameter, one could save time by performing only an inspection, i.e. sensing or scanning, of the portions of the image that are needed, rather than scanning the entire area of interest.

According to an aspect of the present invention, a method is proposed for determining a measurement sequence for inspecting a structure using an inspection tool, the measurement sequence e.g. indicating which parts or portions of an area of interest need to be inspected. The method may thus be used to determine, beforehand, which parts or portions of an area of interest, i.e. an area containing a structure that is to be inspected, need to be inspected, e.g. in view of the parameters of the structure one would like to assess.

In order to determine such a measurement sequence, use is made of a mathematical model of the system that is applied to generate the structure. As an example, the structure may e.g. be a patterned resist layer on a semiconductor substrate, such a patterned resist layer being obtained by a process involving a lithographic exposure process and a subsequent development process.

In an embodiment, a mathematical model of a lithographic system, e.g. including a lithographic apparatus as discussed above, is used to derive a measurement sequence for a structure on a semiconductor substrate, the structure being obtained by a process involving an exposure process performed by the lithographic system.

As will be appreciated by the skilled person, there are various ways to model physical systems or processes performed by such systems. Considering a lithographic system configured to perform an exposure process, thereby exposing a substrate to a patterned beam of radiation, there may thus be various ways to model such a system. The examples of such models given below merely serve to illustrate this, since the invention is not limited to be used in combination with a particular model or type of model.

Figure 3:
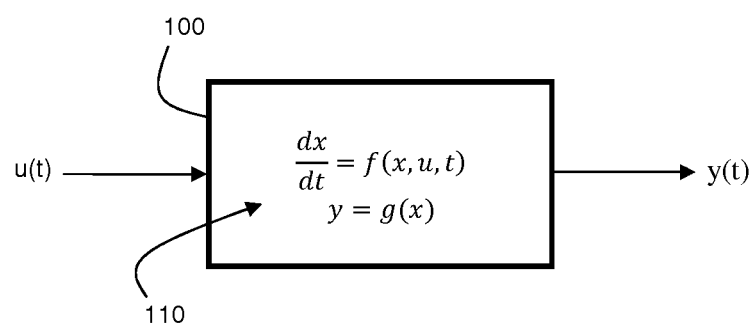
FIG. 3 depicts a mathematical model of a physical system.

In an embodiment, the mathematical model of the lithographic system may be a state-space model or state-space representation of the lithographic system. FIG. 3 schematically shows a state-space representation of a physical system 100, e.g. a lithographical system. In general, a state-space model of a physical system is a mathematical model whereby a set of input variables u, a set of output variables y and a set of state variables x are linked by a set of first-order differential equations, e.g. as indicated by the set of equations 110. The sets of input, output and state variables may e.g. be represented by vectors, whereby u is used to denote the input variables, y is used to denote the output variables and x is used to denote the state variables. The state space model of a physical system may then, in general, be represented by the following set of equations:

$$\frac{dx}{dt} = A(T)*x(t) + B(t)*u(t) \quad (1)$$
$$y(t) = C(t)*x(t) + D(t)*u(t)$$

In general, A(t), B(t), C(t) and D(t) may thus be matrices including time-dependent parameters.

In case of a process involving the creation of a patterned resist layer on a semiconductor substrate, the set of input variables u may e.g. include:
the mask or patterning device (MA) used to impart a radiation beam;
parameters or characteristics of the lithography system including:
characteristics of the source including:
uniformity
applied dose by the source;
characteristics of the illumination system and the projection system including
models of the various optical components;
aberrations of the illumination system or the projection system;
characteristics of the scanning process performed, etc. . . .

In such a process, the set of state variables x may include the various states of the applied radiation beam as it propagates through the lithographic system. As illustrated in FIG. 1, a lithographic system or lithographic apparatus LA may comprise a radiation source SO and beam delivery system BD configured to deliver a radiation beam to an illuminator IL of the apparatus LA. Such an illuminator IL may be represented as a system in which the supplied radiation beam undergoes different transitions or transformations. In particular, the various optical components present in such an illumination system or illuminator IL may each transform the radiation beam such that the radiation beam undergoes a sequence of transformations to different states before arriving at the patterning device MA. Subsequently, the transformed radiation beam is imparted by the patterning device MA, which imparting can be considered yet another transformation of the transformed radiation beam, to yet another state. During its propagation through the projection system PS, the patterned radiation beam will undergo further transformations, before arriving on the substrate, where the patterned beam will irradiate the resist layer, thereby modifying the material characteristics of the irradiated portions of the resist layer.

As will be understood by the skilled person, each of the transitions described may be modeled when the characteristics of the optical components involved are known.

In case of a process involving the creation of a patterned resist layer on a semiconductor substrate, the set of output variables y may e.g. comprise a representation of the structure obtained by the process. In an embodiment of the present invention, an image, e.g. a two-dimensional digital image, of the structure as obtained by an inspection tool such as a SEM may be considered a representation of the structure as present on the substrate.

Such an image can e.g. correspond to an image as discussed above, i.e. an image whereby an entire area of interest is scanned using an inspection tool.

Figure 4:
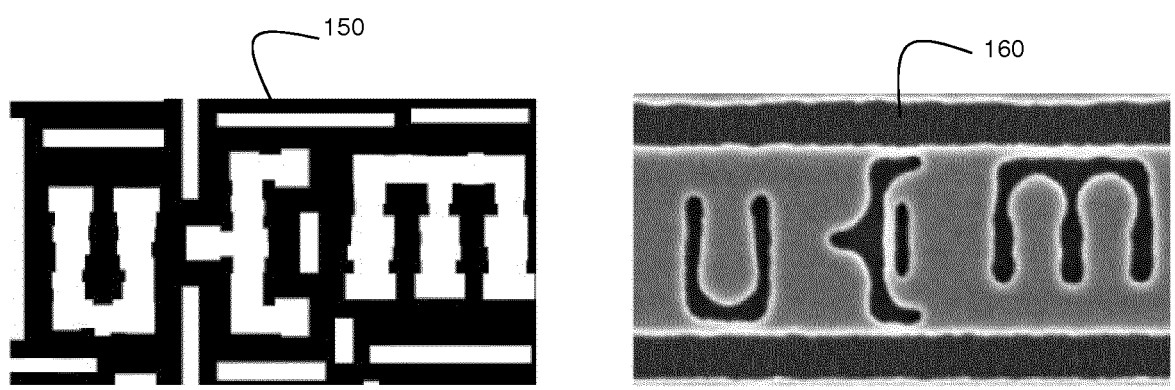
FIG. 4 depicts a patterning device and a resulting image of a structure.

As such, the state-space model as illustrated in FIG. 3, may e.g. represent the relationship between a given mask or patterning device MA and a structure, or representation thereof, created on a substrate. FIG. 4 schematically illustrates a portion of a mask or patterning device 150 and a corresponding image 160 generated by a SEM.

Referring to the various sets of variables of the state-space model as discussed above, it can be noted that these variables may either be known in advance, e.g. from design data, or may be determined empirically.

As mentioned, the method according to the present invention of determining a measurement sequence for an inspection tool makes use of a mathematical model of a lithographic system performing a lithographic process for generating a structure on a substrate. An example of such a model is a state space model as described above. The general model as described above may be used to both model the transient behavior of a lithographic system and the steady state behavior.

In an embodiment of the present invention, the model as applied is merely intended to represent or describe the steady-state behavior of the lithographic system performing the lithographic process. When merely modeling the steady-state behavior, a simplified model of the lithographic system can be used. Referring to equation (1), the steady state behavior of a system can be described as:

$$0 = A*x + B*u$$
$$y = C*x + D*u \quad (2)$$

In a more general formulation, the steady-state behavior of a physical system can be described by a relationship between one or more output variables y and a set of variables including state variables x and input variables u. such a relationship can e.g. be denoted as:

$$y = F(x,u) \quad (3)$$

in case the set of variables x and u is combined, e.g. referring to X as a set of system variables including the input variables u and the state variables x, equation (3) can be written as:

$$y = F(X) \quad (4)$$

In matrix notation, the relationship between the output variable or variables y and the system variables X can be expressed as:

$$y = F * X \quad (5)$$

wherein X e.g. contains both the input variables u and the state variables x.

In the present invention, a mathematical model of a lithographic system is used, the mathematical model the model including a relationship between an set of system variables describing the lithographic system and an output variable representing a structure resulting of the lithographic process performed by the lithographic system, In case the output variably y is a representation of a structure on a semiconductor substrate as e.g. obtained by an inspection tool, the output variable y may be a two-dimensional image, e.g. containing n×m pixels, each having a grey-scale value. An example of such an image is shown in FIG. 4. In such case, each pixel y(i, j) of the two-dimensional image can be considered to have a value that is a function of the system variables X, i.e. each pixel value y(i, j) can be describes as a function of a set of variables comprising state variables and the input variables. Within the meaning of the present invention, the mathematical function, e.g. F, describing a pixel value of the output variable as a function of the state variables and the input variables may also be referred to as a projection.

In case the output variable y corresponds to an entire image of the area of interest, i.e. corresponding to the situation whereby the entire area of interest is scanned, the output variable will be referred as $y_{tot}$ and the projection of the state variables and input variables to the output variable will be referred to as G, i.e.

$$y_{tot} = G(X) \text{ or } y_{tot} = G * X \quad (6)$$

$y_{tot}$ may e.g. be a vector containing the pixel values of an image of a structure on a substrate, X being a set of system variables describing the lithographic system that performed the process of generating the structure, G being a projection of X, describing the relationship between the system variables X and the image $y_{tot}$.

Although in the above, reference is made to a state-space model of the lithographic system, it can be pointed out that alternative formulations of the relationship between the output variable y(i, j) and a set of system variables may be considered as well. As an example, a logistic regression model may be considered as well to describe an image obtained by an inspection tool such as a SEM as a function of a plurality of parameters or variables.

Figure 5:
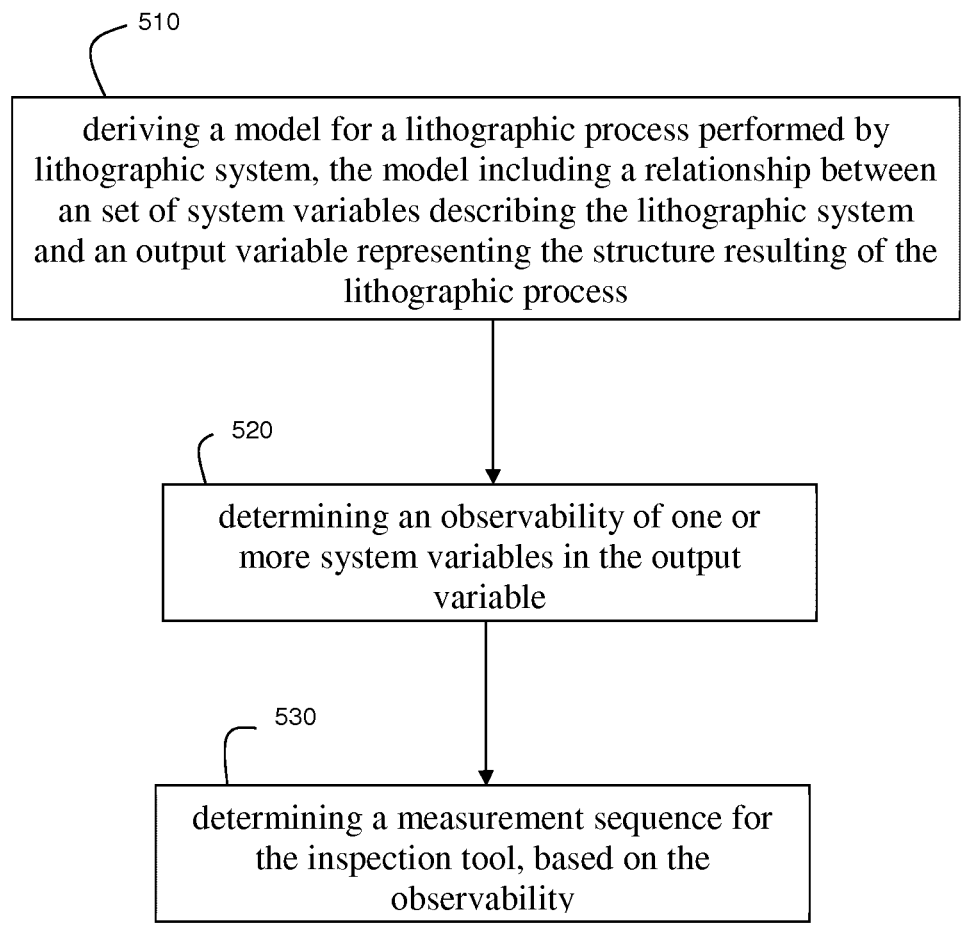
FIG. 5 depicts a flow-chart of a method according to the present invention.

In an embodiment, the present invention makes use of a mathematical model to determine a measurement sequence for inspecting a structure as represented by the image y(i, j). In particular, the present invention provides in a method of determining a measurement sequence for an inspection tool inspecting a structure generated by a lithographic process performed by a lithographic system, whereby the method comprises the following steps, as illustrated in the flow-chart of FIG. 5:

In a first step 510, the method according to the present invention provides in deriving a model for the lithographic process as performed by the lithographic system, the model including a relationship between an set of system variables describing the lithographic system and an output variable representing the structure resulting of the lithographic process. Such a model may e.g. comprise a projection G of a set of system variables X, as discussed above.

In a second step, 520, the method according to the present invention, comprises determining an observability of one or more system variables in the output variable. Within the meaning of the present invention, determining an observability of one or more system variables in the output variable refers to the process of assessing whether or not, or to what extend, a variation of a selected system variable of the system variables X results in a change of the output variable. One can thus assess which output variable or part of the output variable is sensitive to changes of the system variable X. Referring to the above described mathematical model describing the relationship between $y_{tot}$, e.g. describing the pixel values of an image of a structure on a substrate and a set of system variables X describing the lithographic system that performed the process of generating the structure, one can thus assess, which parts of the image $y_{tot}$, i.e. which pixels of the two-dimensional image of the structure are (the most) sensitive to changes of the system variables X. In particular, one can identify, by applying variations to the system variables X, which pixels y(i, j) remain substantially the same or are hardly affected by the applied variations. If such pixels are identified, i.e. pixels which substantially will have the same grey-scale value, irrespective of modifications to one or more of the system variables X, it will be apparent that there is no need to inspect the structure at the corresponding locations. Using the described approach, one can thus determine where the most informative portions of an image of a structure are located, i.e. those portions or pixels that are affected by variations in a selected system variable of the system variables X. The above described approach also allows to identify whether or not the information that can be retrieved contains redundant information. In case one has identified which portions of an image of a structure are sensitive to the mentioned variations, it may still be possible to retrieve the required information from a subset or said portions, thus further limiting the portions or locations of the structure that need to be inspected.

As such, based on the observability performed, one can e.g. assess which part of the output variable representing the structure obtained by the lithographic process is affected by changes in the system. Once this part has been identified, one may, in a third step 530 of the method according to the present invention, determine a more suited measurement sequence for an inspection tool that is to measure the structure, based on the observability. In particular, a more suited measurement sequence, compared to a measurement sequence whereby the entire area of interest is scanned, can be determined. Such a measurement sequence may e.g. skip certain portions of the area of interest, e.g. portions where one expects that the measurement result will not be affected, irrespective of the system variables X. Or, phrased differently, one can determine a measurement sequence whereby portions of the area of interest are measured which are affected by changes in the system variable or variables. In some embodiments, the observability metric, in addition to assessing how sensitive locations of the measured output are to the system variables, it further quantifies how unique and independent these sensitivities are.

It is submitted that, when such a measurement sequence is performed, the duration of the measurement or inspection process can be reduced, since only relevant parts of the area of interest need to be scanned or sampled by the inspection tool.

As a result of such a measurement sequence, one would thus typically obtain a limited or incomplete image, i.e. an image that does not cover the entire area of interest. In other words, the image is subsampled. Only a fraction of the image is measured. Such an image, as obtained when a measurement sequence as derived using the method according to the invention is performed, may be referred to as a reduced or partial image $y_{red}$. Given this reduced image, system variables X are inferred via estimation techniques such as Bayesian estimation, Kalman filtering, etc. Given this inference of the system variables, the entire image can be reconstructed. In a similar manner as discussed above, one can describe such an image $y_{red}$ as a projection of the system variables X, e.g. a projection $G_{red}$:

$$y_{red} = G_{red} * X \quad (7)$$

In an embodiment of the present invention, the partial or reduced image $y_{red}$ can be used to reconstruct an image of the entire area of interest. In particular, using equation (7), one can determine an estimate of the system variables X, Xest as:

$$X_{est} = G_{red}^{-1} * y_{red} \quad (8)$$

Regarding the determination of the estimate $X_{est}$, it is submitted that techniques such as Kalman filtering, sequential Monte Carlo, particle filtering or moving horizon estimation could be applied.

Once the estimate has been determined, it can be used to obtain a reconstructed image yrec, representing the entire area of interest by (e.g., for a linear system):

$$y_{rec} = G * (G_{red}^{-1} * y_{red}) \quad (9)$$

In a similar manner, rather than aiming to obtain an entire image of a structure present in an area of interest of a substrate, the above described approach may be applied to determine particular parameters or features of a structure. In particular, rather than obtaining an image of a structure, one may be more interested in particular parameters such as line edge roughness or line width roughness or CD or CD uniformity. In a similar manner as discussed above, one can determine a measurement sequence which provided the required information for assessing these parameters, without performing unnecessary measurements.

The inspection method according to the present invention may be performed by an inspection tool according to the present invention. In an embodiment, such an inspection tool may be an electron beam (e-beam) inspection tool, as e.g. depicted in FIG. 2.

Such an inspection tool may e.g. comprise:
- an object table configured to hold a sample, the sample comprising a structure;
- an electron beam source configured to generate an electron beam;
- a beam manipulator configured to direct the electron beam onto the sample;
- a detector configured to detect a response signal of the sample caused by interaction of the electron beam with the sample; and
- a processing unit configured to:
  - receive the response signal from the detector;
  - generate an image of the structure based on the response signal;

In accordance with the present invention, the processing unit may further be configured to:

- receive a measurement sequence for inspecting the structure, the measurement sequence being obtained by a method according the invention and
- inspect the sample according to the received measurement sequence.

More details on such an inspection tool are described with reference to FIGS. 6A, 6B and 7.

Figures 6A, 6B:
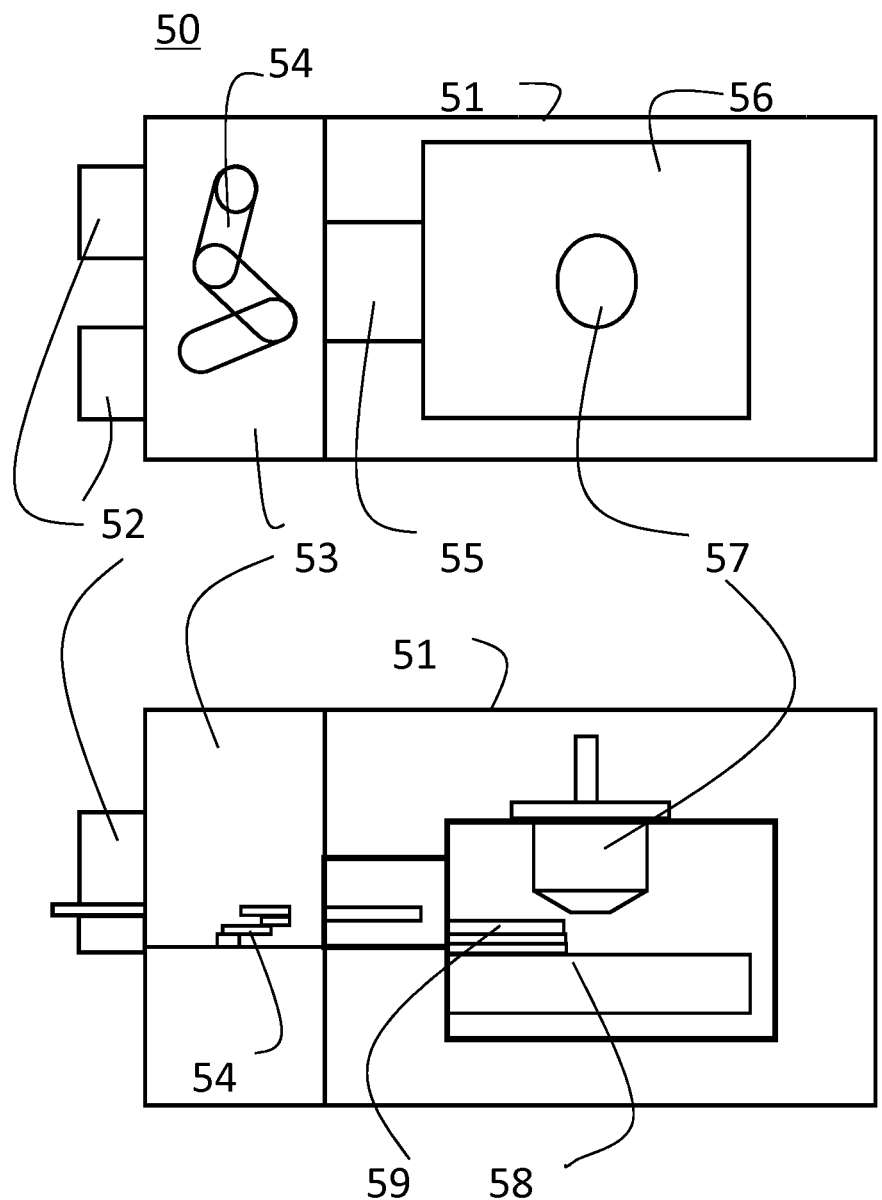
FIGS. 6a and 6b schematically depicts a top view and a side view of an inspection tool according to the present invention.

FIGS. 6A and 6B schematically depict a top view and a cross-sectional view of an inspection tool 50 according to an embodiment of the present invention. The embodiment as shown comprises an enclosure 51, a pair of load ports 52 serving as an interface to receive objects to be examined and to output objects that have been examined. The embodiment as shown further comprises an object transfer system, referred as an EFEM, equipment front end module 53, that is configured to handle and/or transport the objects to and from the load ports. In the embodiment as shown, the EFEM 53 comprises a handler robot 54 configured to transport objects between the load ports and a load lock 55 of the EBI system 50. The load lock 55 is an interface between atmospheric conditions occurring outside the enclosure 51 and in the EFEM and the vacuum conditions occurring in a vacuum chamber 56 of the inspection tool 50. In the embodiment as shown, the vacuum chamber 56 comprises an electron optics system 57 configured to project an e-beam onto an object to be inspected, e.g. a semiconductor substrate or wafer. The inspection tool 50 further comprises a positioning device 58 that is configured to displace the object 59 relative to the e-beam generated by the electron optics system 57.

In an embodiment, the positioning device may comprise a cascaded arrangement of multiple positioners such an XY-stage for positioning the object in a substantially horizontal plane, and a Z-stage for positioning the object in the vertical direction.

In an embodiment, the positioning device may comprise a combination of a coarse positioner, configured to provide a coarse positioning of the object over comparatively large distances and a fine positioner, configured to provide a fine positioning of the object over comparatively small distances.

In an embodiment, the positioning device 58 further comprises an object table for holding the object during the inspection process performed by the inspection tool 50. In such embodiment, the object 59 may be clamped onto the object table by means of a clamp such as an electrostatic clamp. Such a clamp may be integrated in the object table.

Figure 7:
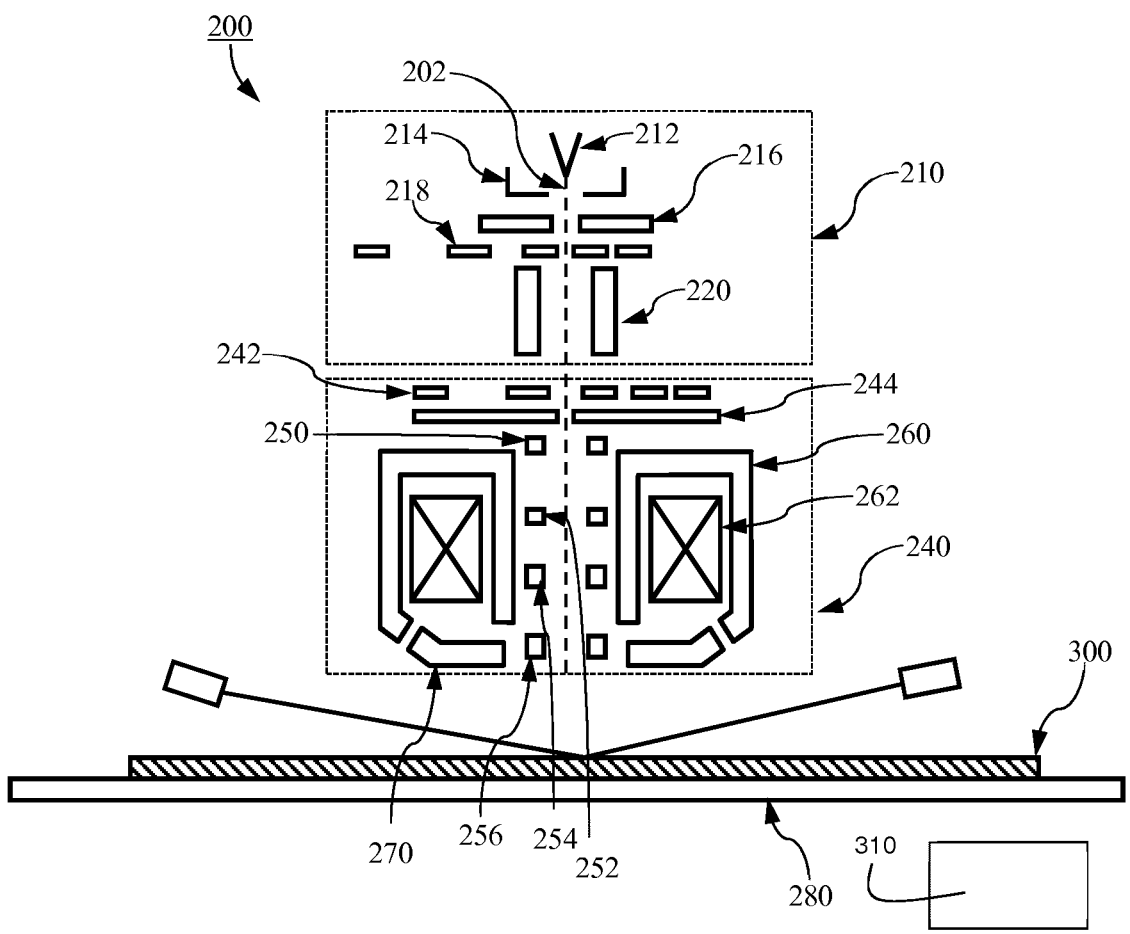
FIG. 7 schematically depicts a more detailed embodiment of an inspection tool according to the present invention.

FIG. 7 schematically depict a more detailed embodiment of an inspection tool 200 according to the present invention, which can be configured to perform the inspection method according to the present invention. The inspection tool 200 comprises an e-beam source, referred to as the electron gun 210 and an imaging system 240.

The electron gun 210 comprises an electron source 212, a suppressor electrode 214, an anode 216, a set of apertures 218, and a condenser 220. The electron source 212 can be a Schottky emitter or modified Schottky emitter as discussed above. By the positive charge of the anode 216, the electron beam 202 can be extracted, and the electron beam 202 may be controlled by using a tunable aperture 218 which may have different aperture sizes for eliminating the unnecessary electron beam outside of the aperture. In order to condense the electron beam 202, the condenser 220 is applied to the electron beam 202, which also provides magnification. The condenser 220 shown in the FIG. 10 may e.g. be an electrostatic lens which can condense the electron beam 202. On the other hand, the condenser 220 can be also a magnetic lens.

The imaging system 240 may e.g. comprise a blanker 248, a set of apertures 242, a detector 244, four sets of deflectors 250, 252, 254, and 256, a pair of coils 262, a yoke 260, and an electrode 270. The electrode 270 may be used to retard and deflect the electron beam 202, and may further have an electrostatic lens function. Besides, the coil 262 and the yoke 260 may be configured to the magnetic objective lens.

The deflectors 250 and 256 can be applied to scan the electron beam 202 to a large field of view, and the deflectors 252 and 254 can be used for scanning the electron beam 202 to a small field of view. All the deflectors 250, 252, 254, and 256 can control the scanning direction of the electron beam 202. The deflectors 250, 252, 254, and 256 can be electrostatic deflectors or magnetic deflectors. The opening of the yoke 260 is faced to the sample 300, which immerses the magnetic field into the sample 300. On the other hand, the electrode 270 is placed beneath the opening of the yoke 260, and therefore the sample 300 will not be damaged. In order to correct a chromatic aberration of the electron beam 202, the retarder 270, the sample 300, and the yoke 260 or part thereof may form a lens to eliminate the chromatic aberration of the electron beam 202. The inspection tool 200 further comprises a processing unit 310, which can e.g. be embodied as a processor, microprocessor, controller, or computer, the processing unit 310 being configured to receive a response signal from the detector or detectors, e.g. detector 244, of the inspection tool and process the response signal into an image of the scanned or examined structure or sample 300.

The embodiments may further be described using the following clauses:

1. A method of determining a measurement sequence for an inspection tool inspecting a structure generated by a lithographic process performed by a lithographic system, the method comprising:
   deriving a model for the lithographic process as performed by the lithographic system, the model including a relationship between an set of system variables describing the lithographic system and an output variable representing the structure resulting of the lithographic process,
   determining an observability of one or more system variables in the output variable, and;
   determining the measurement sequence for the inspection tool, based on the observability.
2. The method according to clause 1, wherein the set of system variables comprises one or more input variables of the lithographic process.
3. The method according to clause 1 or 2, wherein the output variable comprises an image of an area of interest comprising the structure obtained by an inspection tool.
4. The method according to clause 3, wherein the image comprises a two-dimensional digital image of the structure, obtained by an electron beam inspection tool.
5. The method according to any of the preceding clauses, wherein the mathematical model is a steady state mathematical model.
6. The method according to any of the preceding clauses, wherein the model comprises a state-space model of the lithographic system.
7. The method according to any of the clauses 3 or 4, wherein determining an observability of one or more system variables in the output variable comprises determining which part of the image is affected by changes or modifications of the one or more system variables.
8. The method according to clause 7, wherein determining the measurement sequence for the inspection tool comprises selecting a part of the area of interest corresponding to the part of the image as an area that is to be measured.
9. Inspection method for inspecting a structure on an area of interest of a substrate, the inspection method comprising the method according to any of the preceding clauses.
10. The inspection method according to clause 9, further comprising inspecting the structure by the determined measurement sequence.
11. The inspection method according to clause 10, wherein the step of inspecting the structure by the determined measurement sequence comprises obtaining an partial image of the structure.
12. The inspection method according to clause 11, further comprising reconstructing an image of the structure based on the partial image.
13. An inspection tool configured to perform the method according to any of the preceding clauses.
14. Inspection tool comprising:
   an object table configured to hold a sample, the sample comprising a structure;
   probing means configured to inspect the sample;
   a detector configured to detect a response signal of the sample caused by interaction of the probing means with the sample;
   a processing unit configured to:
      receive the response signal from the detector;
      generate an image of the structure based on the response signal;
   wherein the processing unit is further configure to:
      receive a measurement sequence for inspecting the structure, the measurement sequence being obtained by a method according to any of the clauses 1 to 12 and
      inspect the sample according to the received measurement sequence.
15. The inspection tool according to clause 14, wherein the probing means comprise an electron beam source configured to generate an electron beam; and a beam manipulator configured to direct the electron beam onto the sample, and wherein the detector is configured to detect a response signal of the sample caused by interaction of the electron beam with the sample.
16. The inspection tool according to clause 14, wherein the probing means comprise an electron beam source, an X-ray beam source, an optical inspection beam source or an atomic force probe.
17. A computer program product comprising a set of instructions which, when executed on a computer, cause the computer to carry out the method according to any of the clauses 1 to 12.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools.

Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A method of determining a measurement sequence for an inspection tool inspecting a structure generated by a lithographic process performed by a lithographic system, the method comprising:
   deriving a model for the lithographic process as performed by the lithographic system, the model including a relationship between a set of system variables describing the lithographic system and an output variable representing the structure resulting of the lithographic process,
   determining an observability of one or more system variables in the output variable, and
   determining, by a hardware computer system and based on the observability, the measurement sequence for the inspection tool.

2. The method according to claim 1, wherein the set of system variables comprises one or more input variables of the lithographic process.

3. The method according to claim 1, wherein the output variable comprises an image of an area of interest comprising the structure, obtained by an inspection tool.

4. The method according to claim 3, wherein the image comprises a two-dimensional digital image of the structure, obtained by an electron beam inspection tool.

5. The method according to claim 3, wherein determining an observability of one or more system variables in the output variable comprises determining which part of the image is affected by a change or modification of the one or more system variables.

6. The method according to claim 5, wherein determining the measurement sequence for the inspection tool comprises selecting a part of the area of interest corresponding to the part of the image as an area that is to be measured.

7. The method according to claim 1, wherein the model is a steady state mathematical model.

8. The method according to claim 1, wherein the model comprises a state-space model of the lithographic system.

9. An inspection tool comprising:
   an object table configured to hold a sample, the sample comprising a structure;
   a probing device configured to inspect the sample;
   a detector configured to detect a response signal of the sample caused by interaction of the probing device with the sample;
   a processing unit configured to:
      receive the response signal from the detector;
      generate an image of the structure based on the response signal; and
      receive a measurement sequence for inspecting the structure, the measurement sequence being obtained by:
         derivation of a model for a lithographic process as performed by a lithographic system, the model including a relationship between a set of system variables describing the lithographic system and an output variable representing the structure resulting from the lithographic process,
         determination of an observability of one or more system variables in the output variable, and
         determination, based on the observability, of a measurement sequence for the inspection tool;
      inspect the sample according to the received measurement sequence.

10. The inspection tool according to claim 9, wherein the probing device comprises:
    an electron beam source configured to generate an electron beam; and
    a beam manipulator configured to direct the electron beam onto the sample, and
    wherein the detector is configured to detect a response signal of the sample caused by interaction of the electron beam with the sample.

11. The inspection tool according to claim 9, wherein the probing device comprises an electron beam source, an X-ray beam source, an optical inspection beam source or an atomic force probe.

12. The inspection tool of claim 9, wherein the set of system variables comprises one or more input variables of the lithographic process.

13. A computer program product comprising a non-transitory computer-readable medium having a set of instructions which, when executed by a computer system, cause the computer system to at least:
    derive a model for a lithographic process as performed by a lithographic system, the model including a relationship between a set of system variables describing the lithographic system and an output variable representing a structure resulting from the lithographic process,
    determine an observability of one or more system variables in the output variable, and determine, based on the observability, a measurement sequence for the inspection tool.

14. The computer program product of claim 13, wherein the set of system variables comprises one or more input variables of the lithographic process.

15. The computer program product of claim 13, wherein the output variable comprises an image of an area of interest comprising the structure, obtained by an inspection tool.

16. The computer program product of claim 15, wherein the image comprises a two-dimensional digital image of the structure, obtained by an electron beam inspection tool.

17. The computer program product of claim 15, wherein the instructions configured to cause the computer system to determine an observability of one or more system variables in the output variable is further configured to determine which part of the image is affected by a change or modification of the one or more system variables.

18. The computer program product of claim 17, wherein the instructions configured to cause the computer system to determine the measurement sequence for the inspection tool is further configured to select a part of the area of interest corresponding to the part of the image as an area that is to be measured.

19. The computer program product of claim 13, wherein the model is a steady state mathematical model.

20. The computer program product of claim 13, wherein the model comprises a state-space model of the lithographic system.

* * * * *